United States Patent
Jin et al.

(10) Patent No.: US 7,639,341 B2
(45) Date of Patent: Dec. 29, 2009

(54) DISPLAY DEVICE HAVING PARTICULAR LIGHT EMITTING DIODES

(75) Inventors: Dong-Un Jin, Suwon-si (KR); Chan-Young Park, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 162 days.

(21) Appl. No.: 12/003,943

(22) Filed: Jan. 3, 2008

(65) Prior Publication Data
US 2008/0304248 A1    Dec. 11, 2008

(30) Foreign Application Priority Data
Jun. 7, 2007    (KR) .................. 10-2007-0055468

(51) Int. Cl.
G02F 1/1333    (2006.01)
F21V 7/04    (2006.01)
(52) U.S. Cl. .................. 349/162; 349/84; 362/555
(58) Field of Classification Search .................. 349/162, 349/84, 110; 362/555, 561
See application file for complete search history.

(56) References Cited

U.S. PATENT DOCUMENTS 7,132,801 B2 *  11/2006  Park et al. ............... 315/169.3
7,566,902 B2 *  7/2009   Nakashima et al. .......... 257/59

FOREIGN PATENT DOCUMENTS

| JP | 2004-200167 | | 7/2004 |
| JP | 2004200167 A | * | 7/2004 |
| JP | 2005-326757 | | 11/2005 |
| JP | 2005326757 A | * | 11/2005 |
| KR | 10-2004-0099150 | | 11/2004 |
| KR | 10-2005-0043174 | | 5/2005 |
| KR | 10-2005-0112920 | | 12/2005 |
| KR | 10-2006-0017204 | | 2/2006 |
| KR | 10-2006-0042138 | | 5/2006 |

OTHER PUBLICATIONS

Notice of Allowance from the KIPO issued in Applicant's corresponding Korean Patent Application No. 2007-0055468 dated Feb. 29, 2008.

* cited by examiner

Primary Examiner—Mike Qi
(74) Attorney, Agent, or Firm—Robert E. Bushnell, Esq.

(57) ABSTRACT

A display device useful to create an interactive image having different sizes by employing one display panel that is allowed to emit the light toward both directions.

17 Claims, 6 Drawing Sheets

DISPLAY DEVICE HAVING PARTICULAR LIGHT EMITTING DIODES

CLAIM OF PRIORITY

This application makes reference to, incorporates the same herein, and claims all benefits accruing under 35 U.S.C. § 119 from an application entitled DISPLAY DEVICE earlier filed in the Korean Intellectual Property Office on the 7 Jun. 2007 and there duly assigned Serial No. 10-2007-0055468.

BACKGROUND OF THE INVENTION

1. Field of the Invention

The present invention relates to an image display device, and more particularly, to varying image display devices capable of providing dual light emission.

2. Description of the Related Art

Generally, varying image display panels with dual light emission have configurations with two display panels that emit light toward top and bottom directions and that are doubly overlapped with each other.

Contemporary display devices with dual light emission are typically used in folding-type mobile phones. FIG. 1 shows a perspective view of a conventional folder-type mobile phone. The folder-type mobile phone is composed of a main panel 1A and a subpanel 1B to realize an image with the dual light emission. At this time, the subpanel 1B that emits the light toward the outside of the folder operates if a folder of the conventional mobile phone is close, whereas the main panel 1A that emits the light toward the inside of the folder goes into action if a folder of the conventional mobile phone is open.

At this time, the subpanel 1B is manufactured at a smaller size than the main panel 1A. This is done for preventing use of an additional space used for attachment of the flexible printed circuit boards in which parts required for driving is installed by forming the flexible printed circuit boards around the subpanel 1B.

At this time, a liquid crystal display (LCD), an organic light emitting display (OLED) and the like have been generally used as the panel used for the display device.

With such contemporary designs for consumer products such as folding mobile phones, if two panels are used to realize an image with dual light emission, problem occur because products must be made thick in order to accommodate both panels and their address, drive and other ancillary circuits, and the manufacturing costs of the products are higher than consumers are willing to pay.

SUMMARY OF THE INVENTION

Accordingly, it is an object of the present invention to provide an improve dual light emitting panel and an improved process for fabricating dual light emitting panels.

These and other objects may be achieved with a designed to solve such drawbacks of the prior art, and therefore it is another object of the present invention is to provide a display device which is composed of one panel while realizing variable visual images having different areas presented to opposite directions.

One embodiment of the present invention may be achieved by providing a display device including a first light-emitting surface for displaying varying visual images toward a first direction. The display device includes a second light-emitting surface for displaying variable visual images toward the directly opposite direction of the first light-emitting surface. The second light-emitting surface includes a light emitting region and a non-light emitting region. A display panel includes a first light emitting diode that emits the light toward the first direction in its inside, and a second light emitting diode that emits the light toward the second direction; and a light shading apparatus having the light emitting region formed on the display panel and selectively intercepting the light from the light emitting region.

The display device constructed according to the principles of the present invention has a desired effect to display an interactive image having different sizes by employing one dual light emitting display panel. Also, if one display panel is used in the display device, the manufacturing costs may be reduced and the images on both surfaces may all be realized with a fine pitch assembly.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
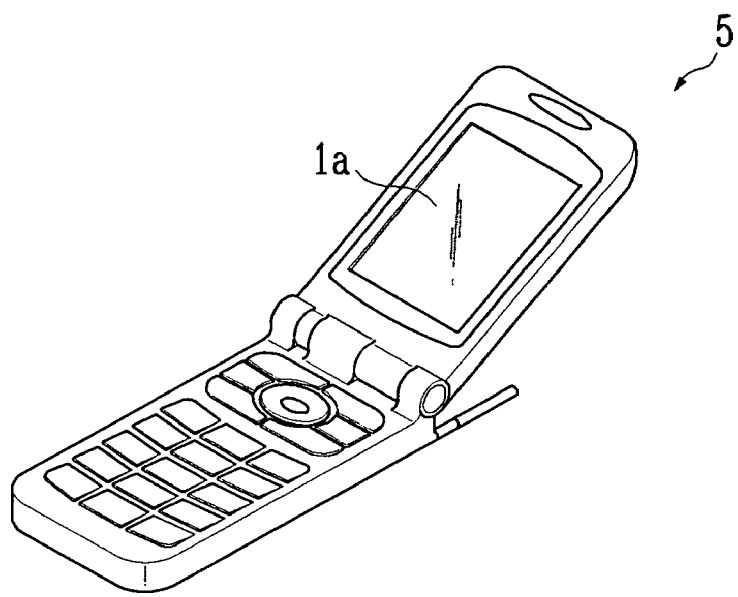
FIG. 1A and FIG. 1B are perspective views showing a contemporary design for a mobile phone equipped with a conventional display device.
Figure 1B:
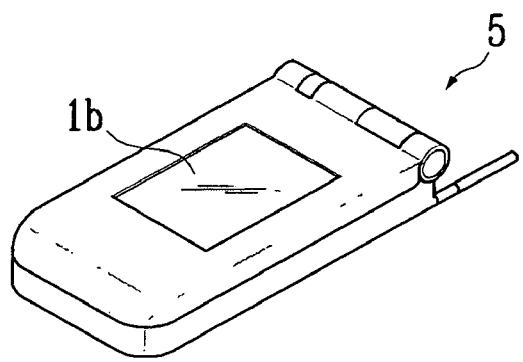

Turning now to the drawings, FIG. 1A shows a simplified representation of a contemporary folding-type mobile cellphone (e.g., a "clamshell) 5 equipped with a visual display device providing with dual light emitting displays, in an opened position, while FIG. 1B shows the same mobile phone 5 in its closed, or folded position. Mobile phone 5 is constructed with a main panel 1a and a subpanel 1b to realize an image with the dual light emitting panels. At this time, subpanel 1b that emits light toward the outside of folded mobile phone 5, operates to display variable visual images when this contemporary mobile phone is closed with its main display panel 1a facing its keypad, whereas main display panel 1a emits light towards the inside of the mobile phone goes into action when mobile phone 5 is in an opened state as is shown in FIG. 1A.

In the contemporary designs shown in FIGS. 1A, 1B, subpanel 1b is manufactured with a smaller size and light emitting display area than main panel 1a. This is done in order to minimize the requirement for additional space to be used to attach flexible printed circuit boards bearing the circuits required for powering, addressing and driving subpanel 1b, by the expedient of positioning those flexible printed circuit boards around subpanel 1b.

At this time, either a liquid crystal display (LCD), or an organic light emitting display (OLED) or the like, have generally been used as light emitting display panels 1a, 1b for mobile phone 5.

If two display panels are used however, to construct a device equipped with dual light emitting display panels, the device is necessarily thick, and the manufacturing costs of the device tends to be higher than is comfortable for many consumers.

Hereinafter, certain exemplary embodiments according to the present invention will be described with reference to the accompanying drawings. Here, when a first element is described as being coupled to a second element, the first element may not only be directly coupled to the second element, but may also be indirectly coupled to the second element via a third element. Additional elements that are not essential to the complete understanding of the invention are omitted for clarity to this detailed description. Also, like reference numerals tend to refer to like elements throughout.

Figure 2:
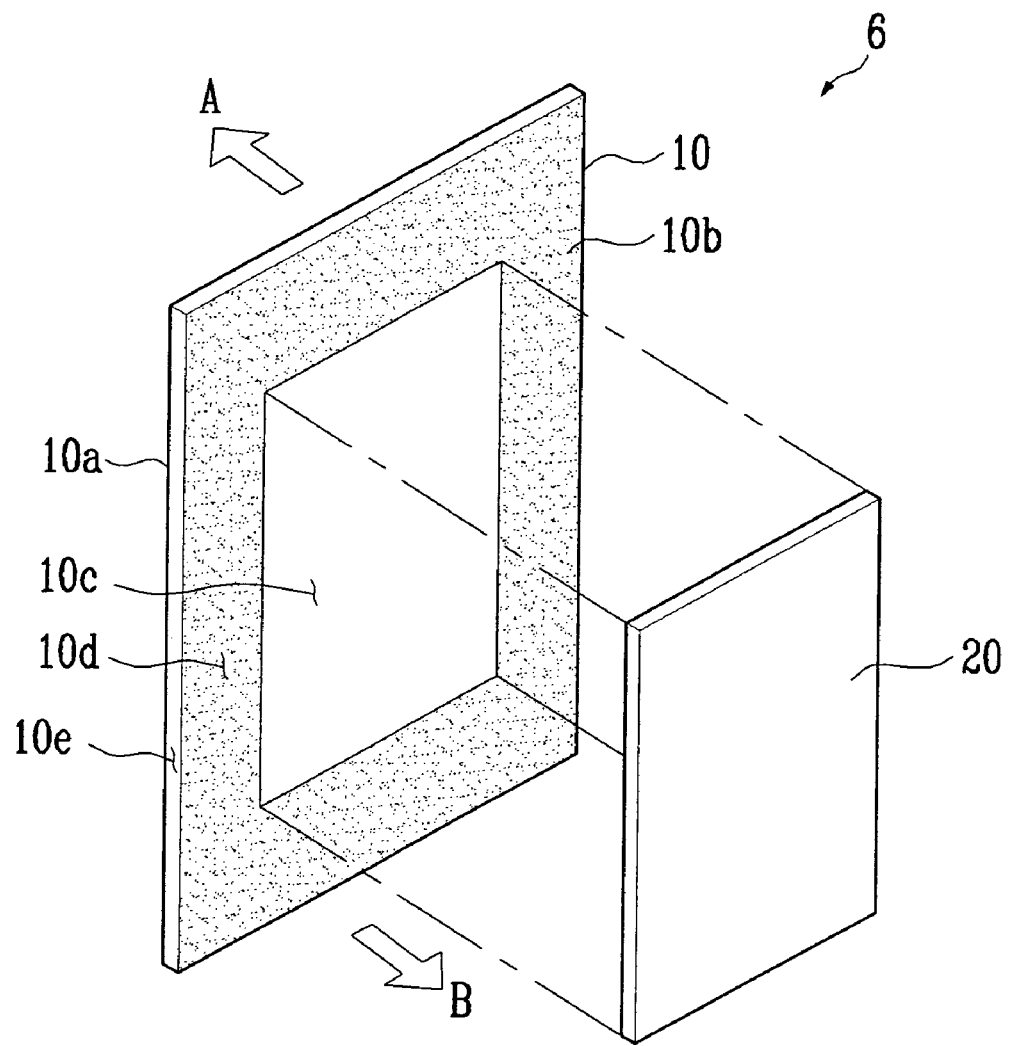
FIG. 2 is an exploded perspective view showing a display device constructed as one exemplary embodiment of the principles of the present invention.

Referring now to FIG. 2, an exploded perspective view showing a display device constructed as one exemplary embodiment of the present invention, display device 6 includes display panel 10 and light shading apparatus 20.

Display panel 10 may be constructed with organic light-emitting display panels in this embodiment. In order to realize a visual image with dual light emission in a single panel, organic light-emitting display panel 10 includes a first light-emitting surface 10a that emits the light toward the top surface in a general direction aligned with arrow A; and a second light-emission surface 10b that emits the light in a diametrically opposite direction, toward the bottom surface in a general direction aligned with arrow B.

At this time, the entirety of the area of first light-emission surface 10a is a light emitting region, and area of second light-emission surface 10b is divided into a light emitting region 10c and a non-light emitting region 10d, wherein the second light-emission surface 10b does not emit light toward the non-light emission region 10d. Non-light emission region 10d, is formed to ensure a space to accommodate flexible printed circuit boards (not shown) coupled to the display panel 10.

That is to say, if the entirety of the major surface areas of first light-emitting surface 10a and second light-emitting surface 10b are both completely light emitting surfaces, the accompanying flexible printed circuit boards necessary to address and drive display device 6 to present varying visual images on both first and second light emitting surfaces 10a, 10b must be fitted along an edge 10e of display panel 10 within a separate area of the consumer product; this causes a deterioration of the quality, ornamental and visual presentation of the product. Consequently, disposition of these and their flexible printed circuit board along edge 10e detracts from the compactness of the consumer product and from its slim appearance, and thus reduces the marketability of the consumer product. This is why, in contemporary designs for consumer products, the flexible printed circuit boards must overlie non-light emitting region 10d, B, of second light-emitting surface 10b.

Figure 3A:
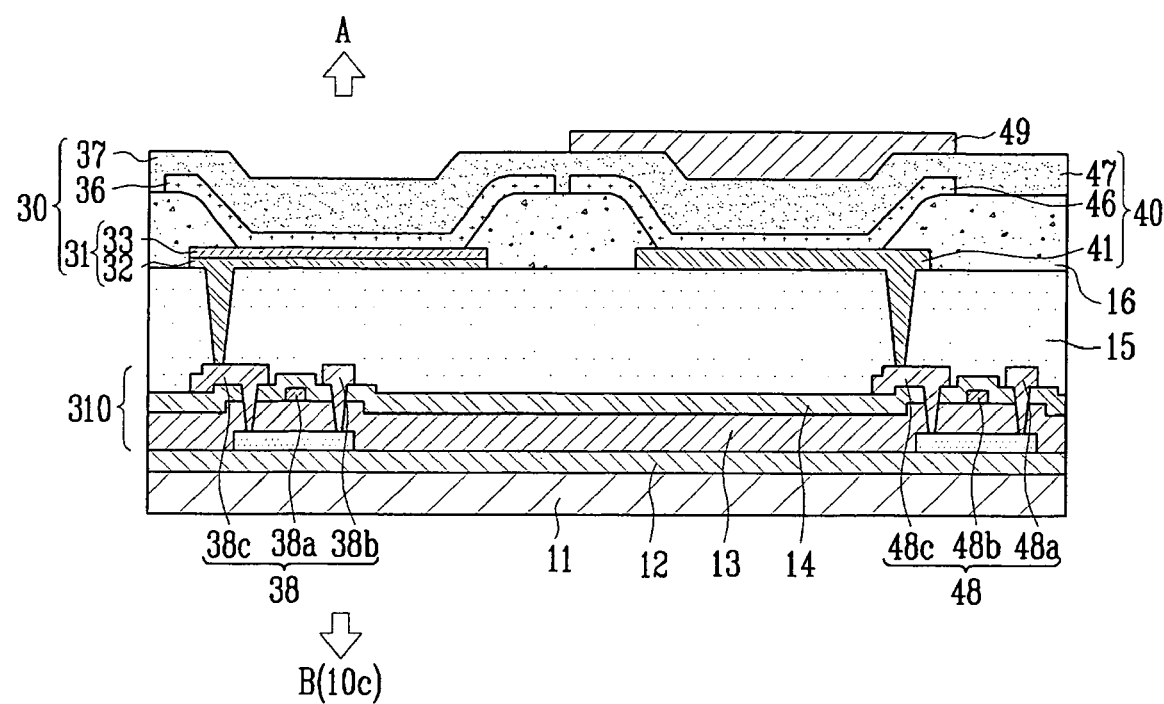
FIG. 3A is a cross-sectional, elevation view showing a light emitting region of the display panel shown in FIG. 1B.
Figure 3B:
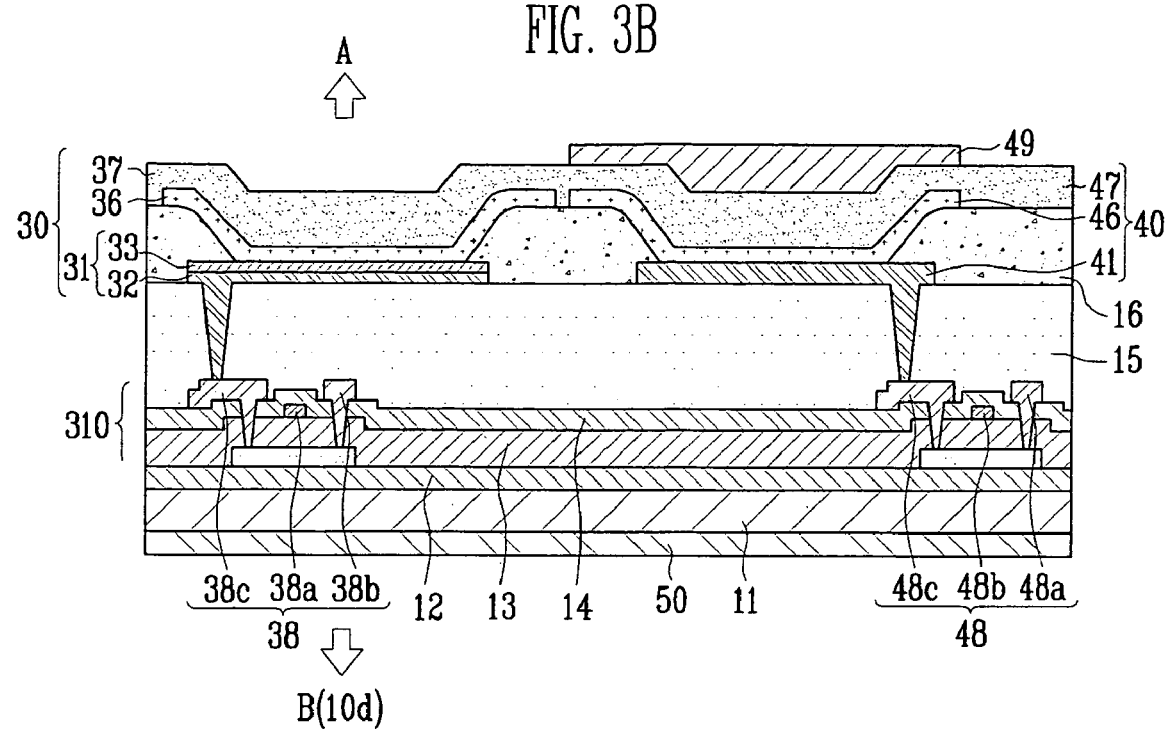
FIG. 3B is a cross-sectional, elevation view showing a non-light emitting region of the display panel as shown in FIG. 1B.

FIG. 3A is a cross-sectional, elevation view showing an organic light-emitting display panel corresponding to light emitting region 10c of second light-emission surface 10b, and FIG. 3B is a cross-sectional, elevation view showing one preferred embodiment of an organic light-emitting display panel corresponding to non-light emitting region 10d, B, of second light-emission surface 10b.

First, the display panel of the organic light-emitting display device corresponding to the light emitting region 10c, B, of the second light-emitting surface 10b includes a plurality of dual light emitting pixels.

Each dual light emitting pixel includes a first light emitting diode 30 that may emit light from the top surface; and a second light emitting diode 40 that may emit light from the bottom surface.

First light emitting diode 30 includes first lower electrode (i.e., anode electrode) 31, a first light-emitting layer 36 formed on first lower electrode 31, and first upper electrode (i.e., cathode electrode) 37 formed on first light-emitting layer 36. More particularly, multi-layered first anode electrode 31 includes lower conductive layer 32, and reflective conductive layer 33 formed on lower conductive layer 32. Here, lower conductive layer 32 is formed of transparent, conductive metal oxides to form an electrically conductive layer 32 that is transparent to light within the visible spectrum, such as, by way of example, ITO (indium tin oxide) and IZO (indium zinc oxide) and the like, and the reflective conductive layer 33 is formed of silver (Ag), aluminum (Al), silver alloys and aluminum alloys. Generally, lower conductive layer 32 is formed on substrate 11 so as to improve adhesivity between reflective conductive layer 33 and its lower layer conductive layer 32.

First light-emitting layer 36 emits light by forming excitons through recombination of electrons and holes supplied from first anode electrode 31 and first cathode electrode 37, respectively. First light-emitting layer 36 may include at least one layer (not shown) selected from among a hole injection layer, a hole transporting layer, an electron transporting layer, and an electron injection layer so as to improve the injection of the electrons and holes. First cathode electrode 37 may be formed of compounds selected from among Al, Ca, MgAg, Ag, etc. In order to enhance transmittance of cathode electrode 37, MgAg or Ca may be deposited at a thickness of approximately 100 Å, and a transparent electrode such as IZO may be formed as an auxiliary layer (not shown) on the MgAg or Ca layer.

The second light emitting diode 40 includes a second anode electrode 41 formed on the substrate 11; a second light-emitting layer 46 formed on the second anode electrode 41; and a first cathode electrode 47 formed on the second light-emitting layer 46. First light emitting diode 30 and second light emitting diode 40 are electrically isolated from each other because second anode electrode 41 is formed to be spaced apart by a predetermined distance form first anode electrode 31. Second anode electrode 41 is formed of transparent conductive metal oxides, for example ITO, IZO and the like to form an electrically conductive layer 41 that is transparent to light within the visible spectrum, such as, by way of example, and the second cathode electrode 47 are formed of compounds selected from Al, Ca, MgAg, Ag, etc. In order to enhance transmittance of cathode electrode 47, MgAg or Ca may also be deposited at a thickness of approximately 100 Å, and a transparent electrode such as IZO may be formed as an auxiliary layer (not shown) on the MgAg or Ca layer.

An upper auxiliary electrode layer 49 covering at least second light-emitting layer 46 is formed on second cathode electrode 47. Compounds such as Al, Ag, Al alloys, Ag alloys and the like may be used in the formation of upper auxiliary electrode layer 49 to prevent light emanating from bottom light emitting diode 40 leaking to the top surface, and to enhance the reflectance in the bottom surface. Second cathode electrode 47 constituting the second light emitting diode 40 and the first cathode electrode 37 constituting the first light emitting diode 30 are not formed separately and are used as a common electrode. Second light-emitting layer 46 emits light in the same manner as in the above-mentioned first light emitting layer 36.

Meanwhile, first and second transistors 38, 48 are electrically coupled to the first light emitting diode 30 and the second light emitting diode 40 via multi-layered anode electrode 31 and transparent second anode electrode 41. At this time, first and second transistors 310, 320 are formed on lower regions of the light emitting element 38, 48 on the substrate 1, respectively. At this time, preferably, no other elements are arranged in the lower region of second light emitting diode 40 so as to improve efficiency of the bottom light emission.

As configured above, an electrical power source may be separately applied to first light emitting diode 30 and second light emitting element 40, or an electrical power source may be applied to first and second light emitting diodes 30,40 at the same time. If user applies an electrical power source to first light emitting element 30, only first light emitting diode 30 emits light, and therefore an image is displayed on the top surface since light is emitted through first cathode electrode 37 in the configuration of first light emitting diode 30. Meanwhile, if the user applies an electrical power source to second light emitting diode 40, only second light emitting diode 40 emits light, and therefore an image is displayed on the bottom surface since light is emitted through second anode electrode 41 in the configuration of second light emitting element 40.

Reference numerals 12, 13, 14, 15, 16 refer to a buffer layer 12, a gate insulating layer 13, an interlayer insulating layer 14, a passivation layer 15 and a pixel definition layer 16, respectively.

Next, display panel 10 of the organic light-emitting display device 6 corresponding to non-light emission region 10d of second light-emission surface 10b is identical to the light emission region in the aspect of the configuration of the inside light emitting elements, but further includes a light-shading layer 50 formed on a light emission path of second light emitting diode 40. Accordingly, the light is intercepted from emitting from the non-light emission region 10d and is thereby prevented from emanating at the bottom surface. Light-shading layer 50 may be, for example, formed of a liquid crystal or similar structure.

Figure 4:
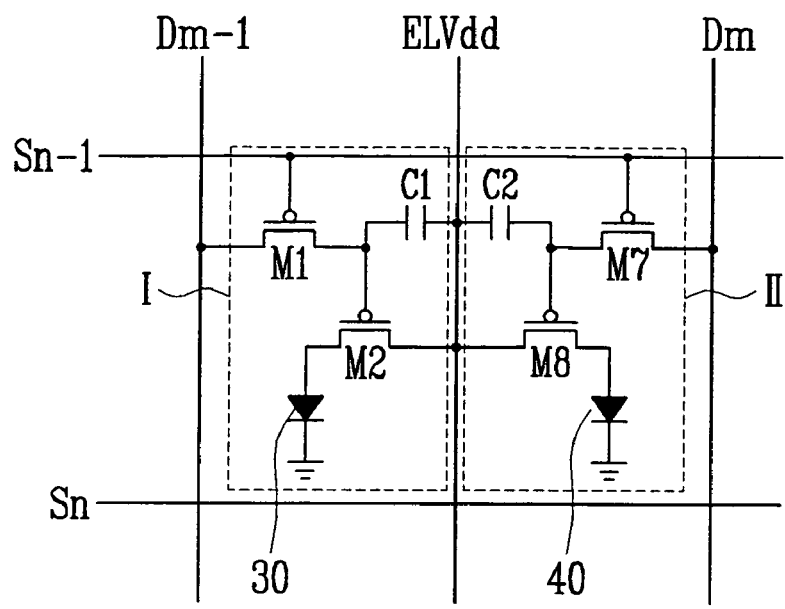
FIG. 4 is a circuit schematic diagram showing one exemplary embodiment of a pixel circuit in the display device constructed according to the principles of the present invention.

FIG. 4 is a circuit schematic diagram showing one preferred embodiment of a dual light emission pixel circuit of the above-mentioned display panel, when constructed with a first pixel circuit I and a second pixel circuit II.

First pixel circuit I may be constructed with a first transistor (e.g., a switching transistor) M1, a capacitor C1 and a second transistor (e.g., a driving transistor) M2, and second pixel circuit II may be constructed with a first transistor (e.g., a switching transistor) M7, a capacitor C2 and a second transistor (e.g., a driving transistor) M8.

Here, first transistor M1 is electrically coupled to scan line Sn-1 and first data line Dm-1, capacitor C1 is coupled to first transistor M1 to charge a voltage corresponding to a first data signal applied from first data line Dm-1. Second transistor M2 has a gate electrode coupled to capacitor C1, and one of the source or drain electrodes electrically coupled to first light emitting element 30.

In second pixel circuit II, the gate electrode of first transistor M7 is electrically coupled to scan line Sn-1 and either the source or drain electrode is coupled to second data line Dm. Capacitor C2 is coupled to the other one of the source or drain electrode of first transistor M7 to charge a voltage corresponding to a second data signal applied from second data line Dm. Second transistor M8 has a gate electrode coupled to capacitor C2, and one of its source or drain electrodes electrically coupled to second light emitting diode 40. First pixel circuit I and second pixel circuit II as configured above may be neighboring along at least one side.

In the configuration of the above-mentioned first pixel circuit I, the top light emission of the first light emitting diode 33 is performed according to the following driving principle. First, if switching transistor M1 is turned on by the scan signal applied through scan line Sn-1, a data signal is supplied to first light emitting diode 30 through first data line Dm-1. At this time, a voltage is stored in capacitor C1; the magnitude of the voltage being obtained by subtracting a voltage level of the data signal from a voltage level of the light emitting element's power source. And, the voltage stored in capacitor C1 is applied to a gate electrode of driving transistor M2, and therefore a constant electric current flows from a source electrode to a drain electrode of driving transistor M2. As a result, an electric current flows in the first light emitting diode 30, and then first light emitting diode 30, shown in FIGS. 3A, 3b and in FIG. 4 as a top-light emitting element, emits light. At this time, first light emitting diode 30 is a top light emitting element that emits the light generated in first light emitting layer 36, through the first cathode electrode 37.

In second pixel circuit II, the principle of operation by second light emitting diode 40 is also identical to the light emission principle for first light emitting diode 30 in first pixel circuit I. First, if a scan signal is applied to switching transistor M7 through the scan line Sn-1 and switching transistor M7 is turned on, a data signal is supplied to second light emitting diode 40 through second data line Dm. At this time, a voltage is stored in capacitor C2, the magnitude of the voltage that is stored is obtained by subtracting a voltage level of the data signal from a voltage level of the light emitting diode's power source. And, the voltage stored in the capacitor C2 is applied to a gate electrode of driving transistor M8, and therefore, a constant electric current flows from a source electrode to a drain electrode of driving transistor M8. As a result, an electric current flows in second light emitting diode 40, and then second light emitting diode 40 emits light as a bottom light emitting diode. At this time, second light emitting diode 40 is a bottom light emitting diode that emits the light, which is generated in the second light-emitting layer 46 by the upper auxiliary electrode layer 49 formed on cathode electrode 47, toward second anode electrode 41.

At this time, first pixel circuit I and second pixel circuit II share power source line ELVdd and scan line Sn, and have different data lines Dm-1, Dm coupled to their respective light emitting diodes 30, 40.

Accordingly, by virtue of employing a single integrated circuit using different data lines Dm-1, Dm coupled to their respective light emitting diodes 30, 40, first pixel circuit I and second pixel circuit II and their respective first light emitting diode 30 and second light emitting diode 40 may separately emit light according to their selection by a user, or alternatively, may emit light at the same time, by employing one driving integrated circuit (i.e., "IC"). That is to say, users may separately display an image in the top and bottom surfaces at the same time, or alternatively, may simultaneously display different visual images on oppositely directed (i.e., top and bottom) display panels.

In the foregoing descriptions of these exemplary embodiments, pixel circuits are described with two transistors and one capacitor coupled to one light emitting diode, but implementation of the principles of the present invention are not particularly limited thereto. And the light emitting diode may further include a compensation circuit which compensates for a threshold voltage and a voltage drop.

Light shading apparatus 20 is installed in the light emission region 10c of second light-emission surface 10b (i.e., the bottom surface). Light shading apparatus 20 selectively intercepts the light emitted from the light emission region. For example, if a folding cover, or lid, of a folding-type mobile phone is closed, a user will be enabled to see a visible image on the second light-emission surface 10b, and therefore the light shading apparatus 20 does not need to intercept the light emitted from the display panel 10. Meanwhile, if a cover, or lid, of a folding type mobile phone is open, the user will be able to see an image on first light-emission surface 10a (i.e., the top surface), and therefore light shading apparatus 20 may intercept the light and may reflect the light toward first light-emitting surface in order to display an image of the first light-emission surface 10a clearly. At this time, light shading apparatus 20 may include a liquid crystal layer, an E-paper or an electrochromic layer.

Figure 5:
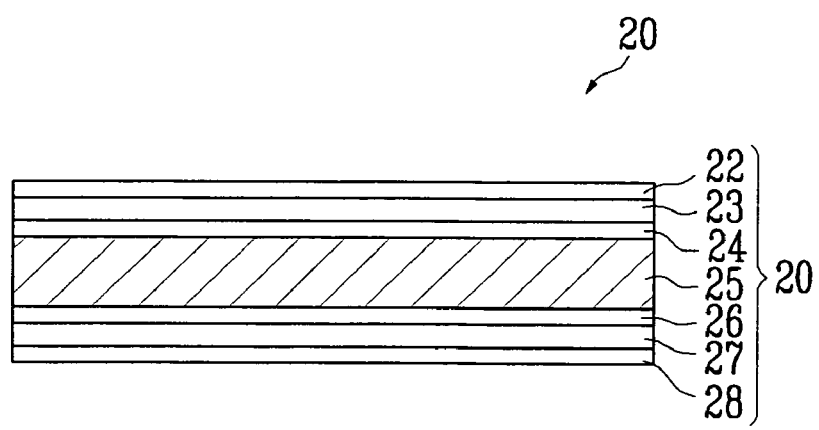
FIG. 5 is a cross-sectional, elevation view showing a light shading apparatus constructed according to the principles of the present invention, as may be applied to the mobile phone shown in FIGS. 1A and 1B.

FIG. 5 shows a cross-sectional view of a light shading apparatus 20 using a liquid crystal layer. Light shading apparatus 20 is arranged so that first substrate 23 can face the second substrate 27. In the construction of light shading apparatus 20, first transparent electrode 24 and second transparent electrode 26 are formed in inner surfaces of first substrate 23 and second substrate 27, respectively. And, liquid crystal layer 25 is interposed between first transparent electrode 24 and second transparent electrode 26, and first polarizer 22 and second polarizer 28 are further provided respectively, on opposite outside surfaces of first substrate 23 and second substrate 27.

At this time, light shading apparatus 20 may selectively intercept, or alternatively, transmit light generated by the integrated circuit as a signal that applied to the transparent electrode 24 and the second transparent electrode 26.

For example, a light source may be passed through first polarizer 22 when first polarizer 22 is in a turned-off state, thereby to transmit only first linearly polarized light matching with a first polarizing axis, and a polarizing state of the first linearly polarized light may be changed into that of a second linearly polarized light while passing through the 90° twisted liquid crystal layer 25, and the second linearly polarized light may match with a transmission axis of second polarizer 28 to pass through a substrate as it is, thereby to transmit the light.

Also, a light source may be passed through first polarizer 22 while first polarizer is in its turned-on state, thereby to transmit only a first linearly polarized light matching with a first polarizing axis, and the first linearly polarized light may transit liquid crystal layer 25 arranged vertically to the substrate as it is, but intercept the light since the first linearly polarized light is intercepted by the second polarizer 28.

Figure 6:
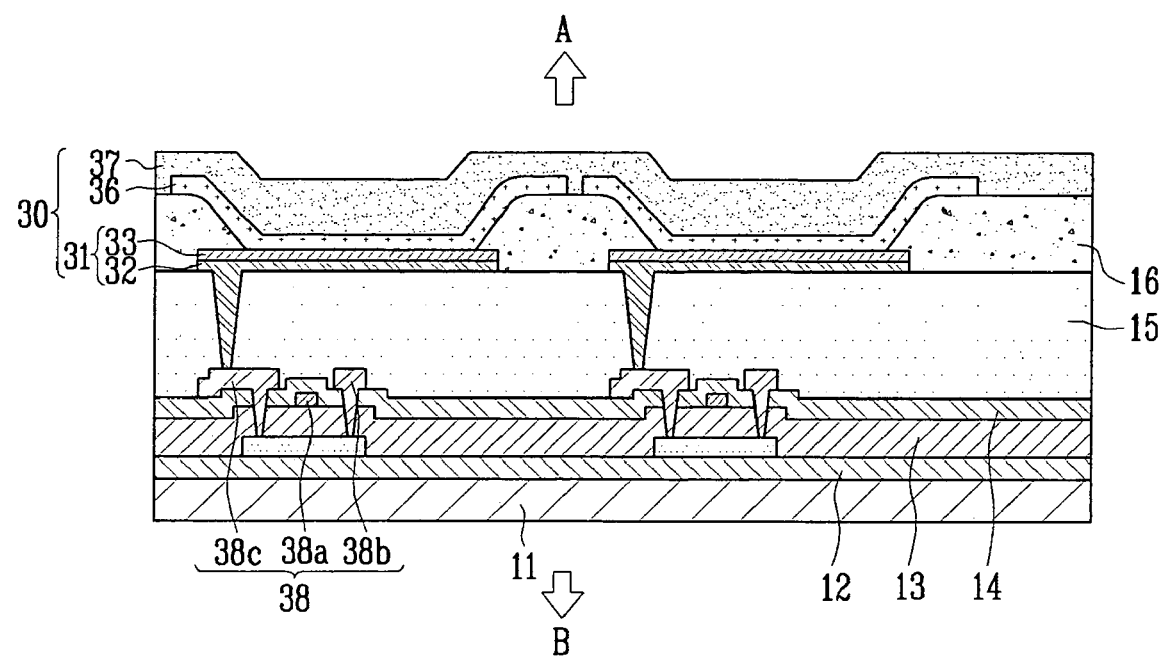
FIG. 6 is a cross-sectional view showing a non-light emitting region of the display panel in a display panel constructed as another exemplary embodiment of the present invention.

Alternatively, the display panel of the organic light-emitting display device, which corresponds to the non-light emission region 10d of the second light-emission surface 10b in display panel 10, may be composed only of first light emitting diodes 30 that emit light toward the top surface, unlike the above-mentioned embodiment. For example, FIG. 6 shows a section in which non-light emission region 10d of second light-emission surface 10b in the display panel is composed only of the first light emitting diodes 30. Accordingly, the light which is emitted toward the bottom surface is intercepted in the non-light emission region 10d, and this embodiment may have the same effect as in the first embodiment.

The description proposed herein is just a preferable example for the purpose of illustrations only, not intended to limit the scope of the invention, so it should be understood that other equivalents and modifications could be made thereto without departing from the spirit and scope of the invention as apparent to those skilled in the art. For example, the inside structure of the display panel, the materials of the light-shading layer, the inside configuration of the light shading apparatus, etc. may be changed or modified without departing from the spirit and scope of the invention.

Although exemplary embodiments of the present invention have been shown and described, it would be appreciated by those skilled in the art that changes might be made in these embodiments without departing from the principles and spirit of the invention, the scope of which is defined in the claims and their equivalents.

What is claimed is:

1. A display device, comprising:
    a first light-emission surface for displaying an image toward a first direction;
    a second light-emission surface for displaying an image toward the other direction of the first light-emission surface and including a light emission region and a non-light emission region;
    a display panel including a first light emitting diode that emits the light toward the first direction in its inside, and a second light emitting diode that emits the light toward the second direction; and
    a light shading apparatus having the light emission region formed on the display panel and selectively intercepting the light from the light emission region.

2. The display device according to claim 1, wherein the non-light emission region of the display panel includes a light-shading layer for intercepting the light from emitting toward the second direction.

3. The display device according to claim 2, wherein the light-shading layer is composed of liquid crystal.

4. The display device according to claim 1, wherein the non-light emission region of the display panel includes only a first light emitting diode that emits the light toward the first direction.

5. The display device according to claim 1, wherein the first light emitting diode and the second light emitting diode are an organic light-emitting diode.

6. The display device according to claim 5, wherein the first light emitting diode includes a first lower electrode having a reflective conductive layer formed on a substrate; a first light-emitting layer formed on the first lower electrode; and a first upper electrode formed on the first light-emitting layer.

7. The display device according to claim 5, wherein the second light emitting diode includes a second lower electrode formed on the substrate; a second light-emitting layer formed on the second lower electrode; a second upper electrode formed on the second light-emitting layer; and an upper auxiliary electrode layer formed on the second upper electrode and covering at least the second light emitting layer.

8. The display device according to claim 1, wherein the first light emitting diode and the second light emitting diode share a power source line (ELVdd) and a scan line (Sn), and different data lines are coupled to each of light emitting diodes of the power source line (ELVdd) and the scan line (Sn), respectively.

9. The display device according to claim 1, wherein the light shading apparatus includes one selected from the group consisting of a liquid crystal layer, an E-paper and an electrochromic layer, which selects the light transmission according to the electrical signal.

10. The display device according to claim 9, wherein the light shading apparatus comprises:
    a first polarizing material contacted with one surface of the dual transparent light-emitting panel;

a first substrate contacted with the first polarizing material;
a first transparent electrode contacted with the first substrate;
a liquid crystal layer contacted with the first transparent electrode;
a second transparent electrode contacted with the liquid crystal layer;
a second substrate contacted with the second transparent electrode; and
a second polarizing material contacted with a lower surface of the second substrate.

11. A display device, comprising:
a first light-emission surface for displaying an image toward a first direction;
a second light-emission surface for displaying an image toward an opposite direction from the first light-emission surface, said second light-emission surface including a light emission region and a non-light emission region;
a display panel comprising:
a first light emitting diode disposed to emit light toward the first direction, the first light emitting diode comprising:
a first lower electrode having a reflective conductive layer formed on a substrate;
a first light-emitting layer formed on the first lower electrode; and
a first upper electrode formed on the first light-emitting layer;
a second light emitting diode disposed to emit light toward the second direction, the second light emitting diode comprising:
a second lower electrode formed on the substrate;
a second light-emitting layer formed on the second lower electrode;
a second upper electrode formed on the second light-emitting layer; and
an upper auxiliary electrode layer formed on the second upper electrode and covering at least the second light emitting layer; and
a light shading apparatus having a light emission region, formed on the display panel and disposed to selectively intercept light from the light emission region.

12. The display device according to claim 11, comprised of:
the first light emitting diode and the second light emitting diode sharing a power source line (ELVdd) and a scan line (Sn), and
different data lines being coupled to each of the light emitting diodes.

13. The display device according to claim 11, wherein the light shading apparatus includes one selected from the group consisting of a liquid crystal layer, an E-paper and an electrochromic layer, which selective controls transmission of the light emanating from the light emitting region according to an electrical signal.

14. The display device according to claim 1, wherein the light shading apparatus comprises:
a first polarizing material contacting one surface of the dual transparent light-emitting panel;
a first substrate contacting the first polarizing material;
a first transparent electrode contacting the first substrate;
a liquid crystal layer contacting the first transparent electrode;
a second transparent electrode contacted with the liquid crystal layer;
a second substrate contacting the second transparent electrode; and
a second polarizing material contacting a lower surface of the second substrate.

15. A display device, comprising:
a first light-emission surface for displaying an image toward a first direction;
a second light-emission surface for displaying an image toward an opposite direction from the first light-emission surface, said second light-emission surface including a light emission region and a non-light emission region;
a display panel comprising a first light emitting diode disposed to emit light toward the first direction, and a second light emitting diode formed on a substrate, the first light emitting diode and the second light emitting diode sharing a power source line and a scan line, and different data lines being coupled to each of the light emitting diodes; and
a light shading apparatus having a light emission region, formed on the display panel and disposed to selectively intercept light from the light emission region.

16. The display device according to claim 15, wherein the light shading apparatus includes one selected from the group consisting of a liquid crystal layer, an E-paper and an electrochromic layer, which selective controls transmission of the light emanating from the light emitting region according to an electrical signal.

17. The display device according to claim 15, wherein the light shading apparatus comprises:
a first polarizing material contacting one surface of the dual transparent light-emitting panel;
a first substrate contacting the first polarizing material;
a first transparent electrode contacting the first substrate;
a liquid crystal layer contacting the first transparent electrode;
a second transparent electrode contacted with the liquid crystal layer;
a second substrate contacting the second transparent electrode; and
a second polarizing material contacting a lower surface of the second substrate.

* * * * *